(12) United States Patent
Abe

(10) Patent No.: US 7,921,341 B2
(45) Date of Patent: Apr. 5, 2011

(54) SYSTEM AND METHOD FOR REPRODUCING MEMORY ERROR

(75) Inventor: Takashi Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 350 days.

(21) Appl. No.: 12/033,231

(22) Filed: Feb. 19, 2008

(65) Prior Publication Data

US 2008/0307172 A1    Dec. 11, 2008

(30) Foreign Application Priority Data

Feb. 23, 2007  (JP) ................................ 2007-044527

(51) Int. Cl.
  *G11C 29/00*    (2006.01)
(52) U.S. Cl. ....................................... 714/719; 714/764
(58) Field of Classification Search .................. 714/718, 714/764, 719
  See application file for complete search history.

(56) References Cited

U.S. PATENT DOCUMENTS

| 5,892,896 A * | 4/1999 | Shingo .............................. 714/8 |
| 6,931,582 B2 * | 8/2005 | Tamura et al. ................. 714/758 |
| 7,102,943 B2 * | 9/2006 | Kanamori et al. ............. 365/200 |
| 7,137,027 B2 * | 11/2006 | Shiota et al. ....................... 714/5 |
| 7,631,244 B2 * | 12/2009 | Suzuki et al. ................. 714/763 |
| 2005/0022073 A1 * | 1/2005 | Urashima ........................ 714/54 |
| 2008/0215954 A1 * | 9/2008 | Oshikiri ........................ 714/764 |

FOREIGN PATENT DOCUMENTS

| JP | 60045853 A | 3/1985 |
| JP | 0553929 A | 3/1993 |
| JP | 11212835 A | 8/1999 |

* cited by examiner

*Primary Examiner* — James C Kerveros

(57) ABSTRACT

An information processing apparatus includes a nonvolatile memory area having a storage area, and a main controller configured to store an access pattern to a main memory in the nonvolatile memory area, to end the storage of the access pattern when an error is detected in the main memory, and to access the main memory based on the access pattern stored in the nonvolatile memory area. The main controller includes a main memory control unit configured to access the main memory based on the access pattern; a nonvolatile memory control unit configured to store a data of the access pattern in the nonvolatile memory area; and a main control unit configured to transfer the access pattern for the main memory to the main memory control unit and the nonvolatile memory control unit.

11 Claims, 7 Drawing Sheets

Fig. 5

| Command | Address | Data | Others |
|---|---|---|---|
| 16 | 17 | 18 | 19 |
| 11101 | 60A0C | B9BB10DB······ | 01000 |
| 10101 | 60E0C | F537BIC8······ | 10000 |
| 11111 | 60E0C | 4AA7E410······ | 10000 |
| ⋮ | ⋮ | ⋮ | ⋮ |

SYSTEM AND METHOD FOR REPRODUCING MEMORY ERROR

This Patent application is based on Japanese Patent Application No. 2007-044527 filed Feb. 23, 2007. The disclosure thereof is incorporated herein by reference.

TECHNICAL FIELD

The present invention relates to a system and method for recording a memory error pattern, and more particularly, to a system and method for recording a memory error pattern, in which access contents between a memory and a memory controller are stored.

BACKGROUND ART

A memory device used in a main memory of an information processing apparatus such as a server is formed from a semiconductor device, which is manufactured to have a defect in a case. The memory device in which an error is caused fixedly due to the defect or the memory device in which an error is caused through a simple test are removed in a delivery test. However, the memory device in which an error is caused in only a specific access pattern is sometimes delivered erroneously. In such a memory device, there is a case that an error is caused in the use state when the memory device is accessed in various patterns for a long time use. In this case, the cause is not found because of no reproducibility, and in another case, the error is caused only when a specific test program is executed for a long time so that analysis is difficult.

For this reason, a method is demanded of improving the reproducibility of an error which occurs only in a certain access pattern.

In conjunction with the above description, a history diagnosis method is disclosed in Japanese Patent Application Publication (JP-A-Showa 60-045853). According to this related art, address data and time data are accumulated.

Japanese Patent Application Publication (JP-A-Heisei 05-053929) discloses a central processing unit with a trouble data storage function. The central processing unit with a trouble data storage function has a trace data storage unit for storing an address and a data of an accessed main storage device therein, and a memory access trace control circuit for controlling read/write of the trace data storage memory.

Japanese Patent Application Publication (JP-A-Heisei 11-212835) discloses an electronic computer for extracting memory rewrite data and a memory control unit. According to the conventional technique, in the computer, a CPU for decoding and executing a program code in a memory, a high-speed storage device for storing memory rewrite data and process-related data therein, and a memory control unit for monitoring the rewrite of the data into the memory are connected to a system bus for data transfer among these devices. The memory rewrite data stored in the high-speed storage device includes buffer data such as a CPU identifier, a write address, memory contents before the write, an effective address and a timer value and additional data such as a process ID before process switching.

SUMMARY

An object of the present invention is to provide a system and method for REPRODUCING a memory error, in which access contents (access pattern) between a memory and a memory controller can be recorded in a memory at the time when an error occurs and reproduce an access pattern.

In an exemplary aspect of the present invention, an information processing apparatus includes a nonvolatile memory area having a storage area, and a main controller configured to store an access pattern to a main memory in the nonvolatile memory area, to end the storage of the access pattern when an error is detected in the main memory, and to access the main memory based on the access pattern stored in the nonvolatile memory area. The main controller includes a main memory control unit configured to access the main memory based on the access pattern; a nonvolatile memory control unit configured to store a data of the access pattern in the nonvolatile memory area; and a main control unit configured to transfer the access pattern for the main memory to the main memory control unit and the nonvolatile memory control unit.

In another exemplary aspect of the present invention, a method of reproducing an error in a main memory, includes storing an access pattern to a main memory in a nonvolatile memory area; stopping the storage of a next one of the access pattern in the nonvolatile memory area when an error is detected in the main memory; and accessing the main memory based on the stored access pattern, when the error is detected in the main memory.

BRIEF DESCRIPTION OF THE DRAWINGS

The above and other objects, advantages and features of the present invention will be more apparent from the following description of certain exemplary embodiments taken in conjunction with the accompanying drawings, in which:

FIG. 5 is a diagram showing an example of contents of memory access patterns stored in a nonvolatile storage area;

EXEMPLARY EMBODIMENTS

Hereinafter, an information processing system according to exemplary embodiments of the present invention will be described in detail with reference to the attached drawings.

In the information processing system according to the exemplary embodiments of the present invention, when a memory is accessed by a memory controller, access patterns are stored in the memory controller. In the storage of the access patterns, the access pattern is stored in a nonvolatile storage area as needed. When the nonvolatile storage area is full, the new access pattern is overwritten on the old access pattern sequentially. When the memory controller recognizes an error, the storage of the access patterns is ended. The memory controller also has a function of repeatedly realizing the access patterns stored in the nonvolatile storage area. This function allows the access pattern to be repeatedly reproduced.

Figure 1:
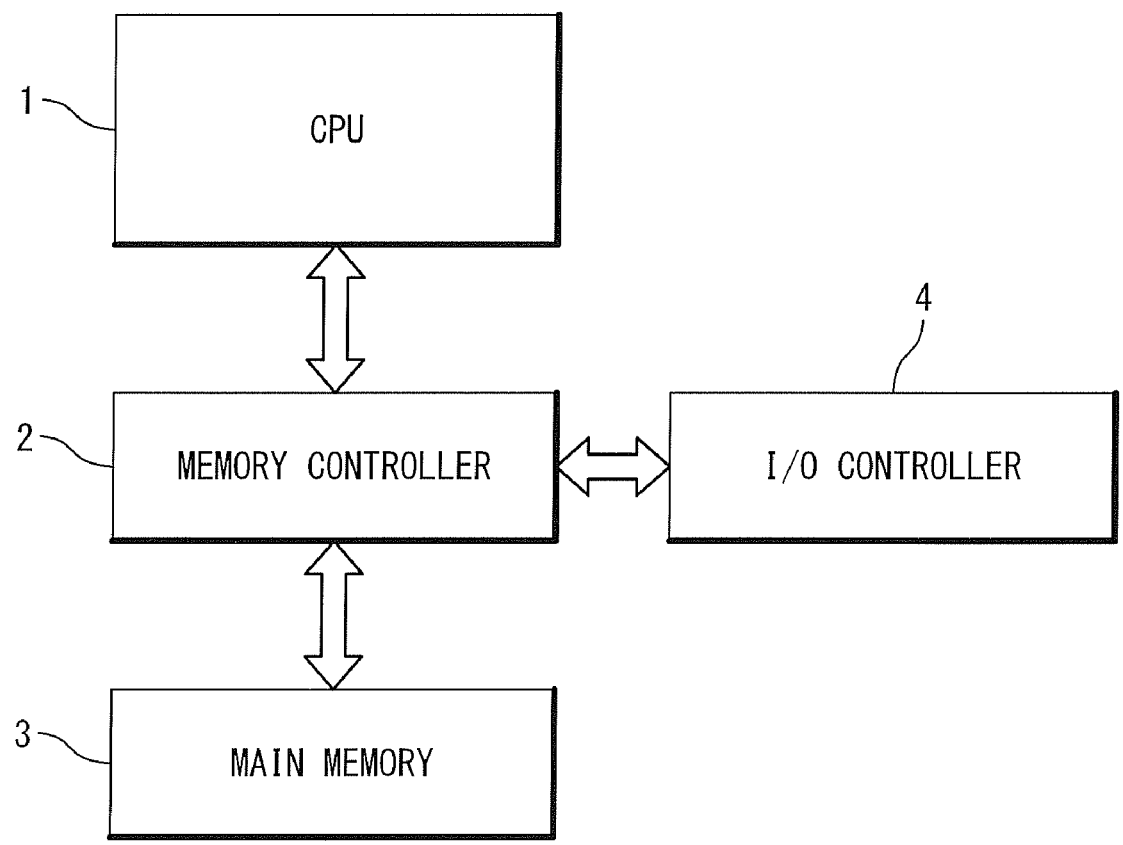
FIG. 1 is a schematic block diagram showing a configuration of a general computer.

FIG. 1 is a block diagram showing a configuration of a general information processing system such as a computer system. The general computer system has a CPU 1, a memory controller 2, a main memory unit 3 and an I/O (input/output) controller 4. The CPU 1 performs control of each of various sections and devices and calculation and processing of data. For example, the CPU 1 receives data from an input unit (not shown) or the main memory unit 3, calculates and processes the data and outputs the calculated and processed data to an output unit (not shown) or the main memory unit 3. The CPU 1 is not limited to a central processing unit and includes a general microprocessor (MPU). The memory controller 2 manages a main memory unit 3. Here, the memory controller 2 is provided between the CPU 1 and the main memory unit 3 and manages transfer of data between the CPU 1 and the main memory unit 3. The main memory unit 3 stores the data in the computer system. The main memory unit 3 includes a semiconductor memory device unit such as a RAM and a ROM as well as an external storage unit (auxiliary storage unit) such as a hard disk drive and a floppy disk (registered trademark) drive. The auxiliary storage unit, the input/output unit and the like are connected to the I/O controller 4. In the data processing system shown in FIG. 1, an access pattern to the main memory unit is not stored.

Figure 2:
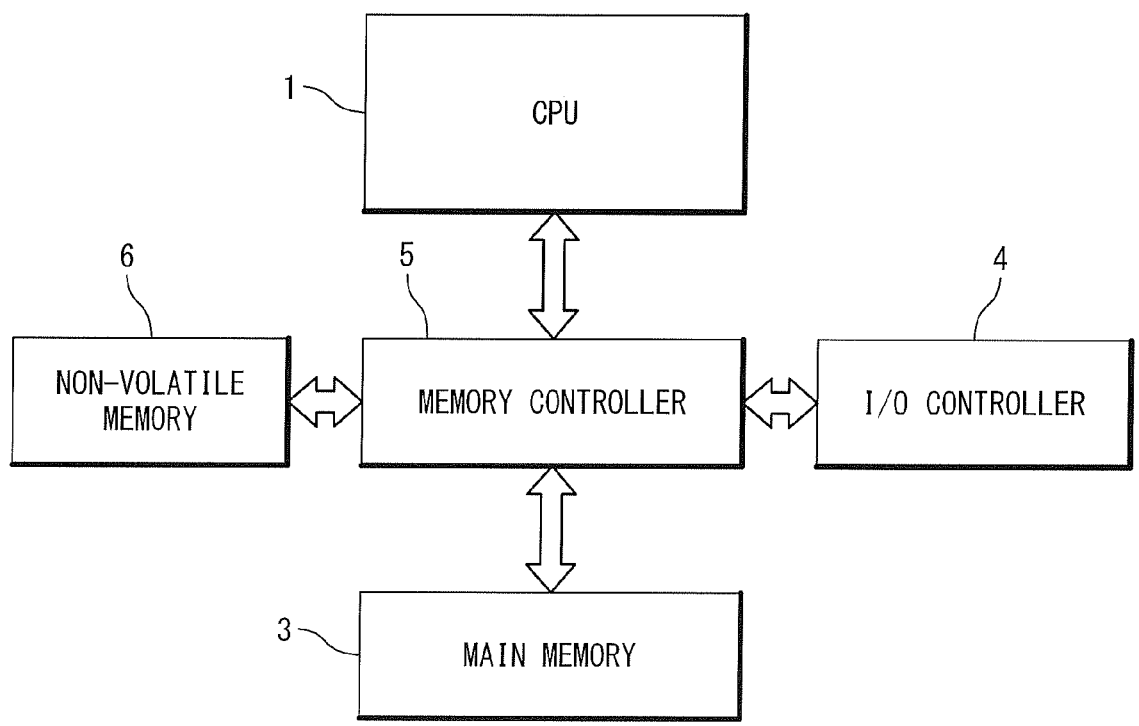
FIG. 2 is a schematic block diagram showing of a computer in which an access pattern to a main memory is recorded.

On the contrary, FIG. 2 is a block diagram showing a configuration of a data processing system according to a first exemplary embodiment of the present invention, in which an access pattern is stored in the main memory unit 3. The computer system according to the first exemplary embodiment of the present invention includes the CPU 1, the main memory unit 3, the I/O controller 4, a memory controller 5 and a nonvolatile memory device 6. The CPU 1, the main memory unit 3 and the I/O controller 4 in FIG. 2 are similar to those in FIG. 1. Therefore, the description of them will be described. The memory controller 5 has a function of storing an access pattern to the main memory unit 3 in the nonvolatile memory device 6. The nonvolatile memory device 6 is used to store the access pattern to the main memory unit.

The memory controller 5 stores the access pattern to the main memory unit 3 in the nonvolatile memory device 6 at an optional time. When an error is detected in the main memory unit 3, a recording operation of the access pattern is stopped or ended. Thus, the access pattern at the time of the occurrence of the error can be stored in the nonvolatile memory device 6. The memory controller 5 has functions of reading out the access pattern stored in the nonvolatile memory device 6 and accessing the main memory unit 3 based on the access pattern. This function allows the access pattern to the main memory unit 3 to be reproduced at the time of the occurrence of the error.

Figure 3:
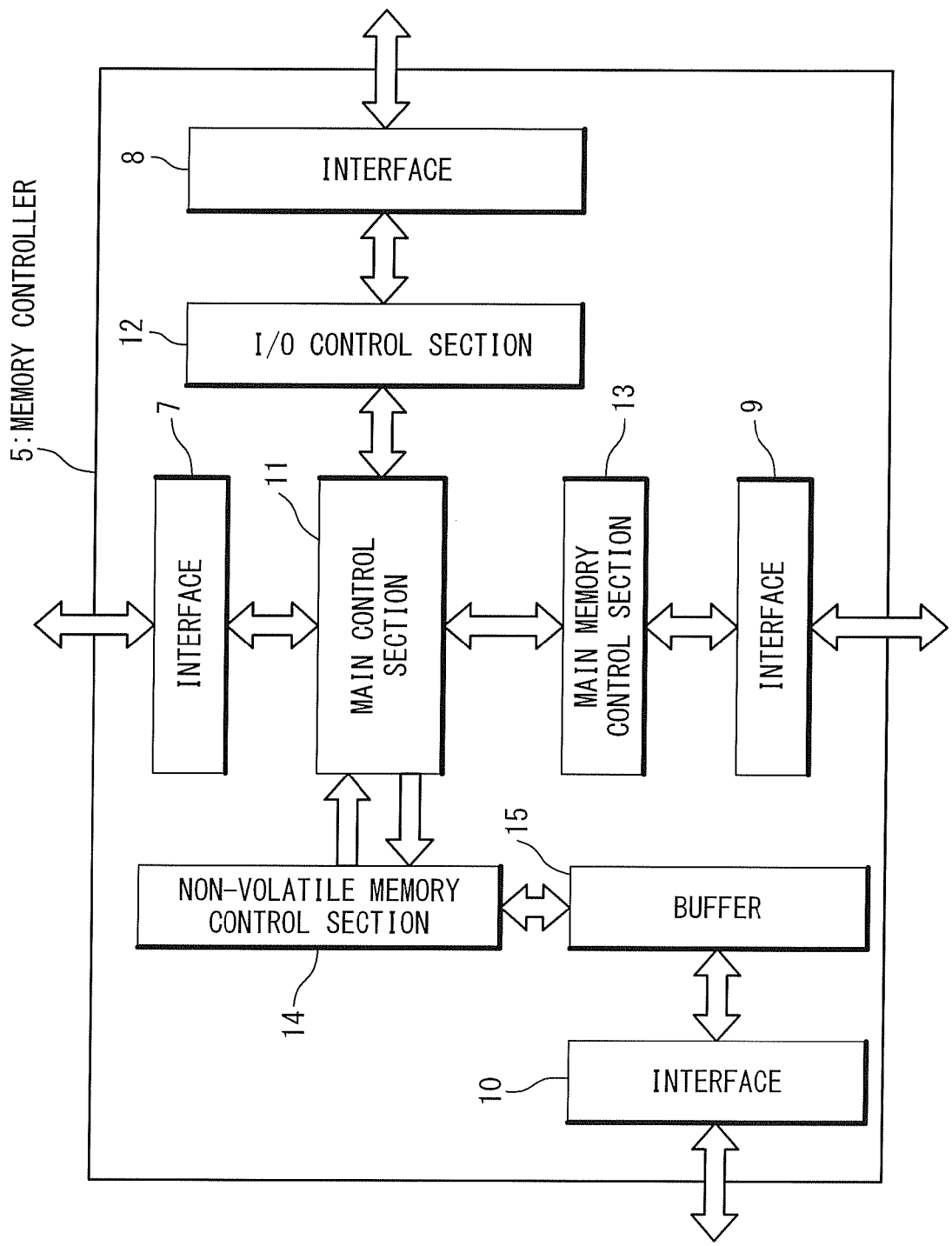
FIG. 3 is a schematic block diagram showing a configuration of a memory controller in an information processing system according to a first exemplary embodiment of the present invention.

FIG. 3 is a block diagram showing the configuration of the memory controller 5 used in the first exemplary embodiment. The memory controller 5 has an interface 7, an interface 8, an interface 9, an interface 10, a main control section 11, an I/O controller control section 12, a main memory control section 13, a nonvolatile storage area control section 14 and a buffer 15.

The interface 7 interfaces transfer of data from/to the CPU 1. The interface 8 indicates transfer of data from/to the I/O controller 4. The interface 9 interfaces transfer of data to/from the main memory unit 3. The interface 10 interfaces transfer of data to/from the nonvolatile memory device 6. The main control section 11 controls each device and circuit in the memory controller 5. The I/O controller control section 12 controls the I/O controller 4. The main memory control section 13 controls the main memory unit 3. The nonvolatile storage device control section 14 controls the nonvolatile memory device 6. The buffer 15 is a storage device or a storage area for temporarily storing data therein to compensate a difference in processing rate or transfer rate during the transfer of the data. A calculation result by the CPU supplied to the main control section 11 via the interface 7, and the main control section 11 issues an instruction to each of the I/O controller control section 12, the main memory control section 13 and the nonvolatile storage device control section 14 based on the calculation result.

Next, an operation of storing a memory error pattern will be described below.

The main control section 11 informs an instruction for the main memory unit 3 to the main memory control section 13 as well as the nonvolatile storage device control section 14. In response to the instruction, the main memory control section 13 accesses the main memory unit 3 and performs a process, and the nonvolatile storage device control section 14 converts the content of the instruction for the main memory unit 3 into a data of a memory access pattern and transfers the memory access pattern data to the buffer 15. The buffer 15 temporarily stores the transferred data to absorb a difference between a data transfer rate of the interface 9 and that of the interface 10. Then, when the memory access pattern data of a predetermined amount are stored in the buffer 15, the data are written into the nonvolatile memory device 6 via the interface 10. The memory access patterns are stored through the above operation. When the main control section 11 recognizes that an error has occurred in the main memory unit 3, the transfer of the instruction to the nonvolatile storage device control section 14 is stopped. Thus, the above operation allows the memory access pattern on the occasion of the error in the main memory unit 3 to be stored.

Figure 4:
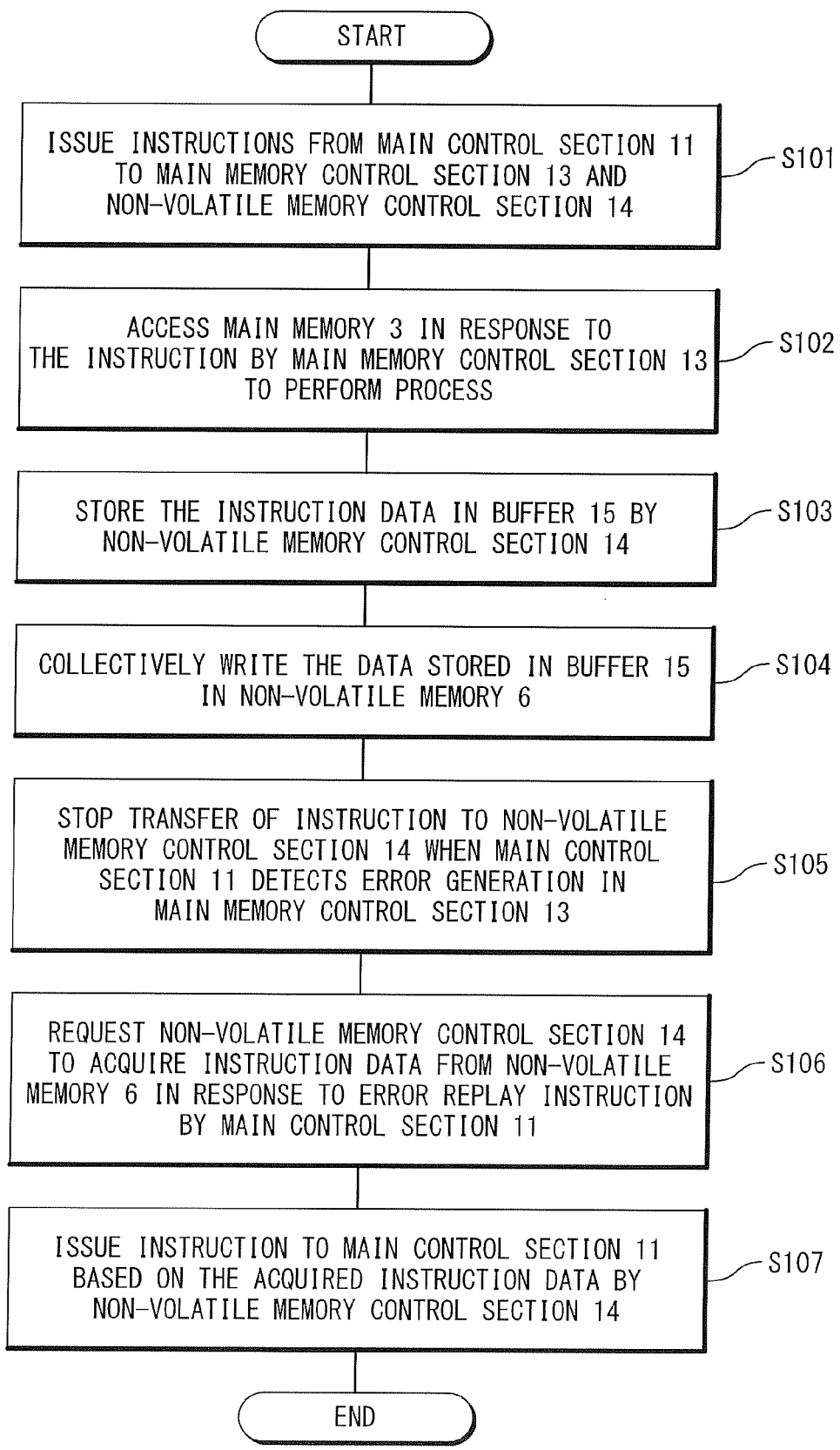
FIG. 4 is a flowchart showing an operation of storing a memory access pattern at the occurrence of an error.

In response to an error reproduction instruction from the CPU 1, the main control section 11 issues a read instruction to the nonvolatile storage device control section 14 to read out the memory access pattern stored in the nonvolatile memory device 6. The nonvolatile storage device control section 14 acquires the memory access pattern stored in the nonvolatile memory device 6 via the buffer 15 and instructs the main control section 11 to access the main memory unit 3 based on the read memory access pattern. The operation allow the memory access pattern on the occasion of the error to be reproduced FIG. 4 is a flowchart showing an operation of the data processing system when the memory error pattern is stored.
(1) Step S101
The main control section 11 informs an instruction for the main memory unit 3 to the main memory control section 13 as well as the nonvolatile storage device control section 14.
(2) Step S102
Based on the instruction, the main memory control section 13 accesses the main memory unit 3 and performs a process.
(3) Step S103
The nonvolatile storage device control section 14 converts the instruction for the main memory unit 3 into data of a memory access pattern and transfers to the buffer 15.
(4) Step S104
The memory access pattern data stored in the buffer 15 is written into the nonvolatile memory device 6 via the interface 10 for every pattern. The write may be performed when the data of a predetermined amount are stored in the buffer 15. Here, the nonvolatile storage device control section 14 stores the memory access pattern data stored in the buffer 15 in the nonvolatile memory device 6 through the interface 10. However, in fact, the memory access pattern data stored in the buffer 15 may be provided in response to an access from an external device having the nonvolatile memory device 6.

(5) Step S105

When the main control section 11 recognizes that an error has occurred in the main memory unit 3, transmission of an instruction to the nonvolatile storage device control section 14 is stopped.

(6) Step S106

In response to an error reproduction instruction from the CPU 1, the main control section 11 issues a read instruction to the nonvolatile storage device control section 14 to acquire the memory access pattern data stored in the nonvolatile memory device 6.

(7) Step S107

The nonvolatile storage device control section 14 acquires the memory access pattern from the nonvolatile memory device 6 via the buffer 15 and instructs the main control section 11 to access the main memory unit 3 based on the acquired memory access pattern.

FIG. 5 shows an example of the memory access patterns stored in the nonvolatile memory device 6 in the present exemplary embodiment. A column of Command 16 shows commands. A column of Address 17 shows addresses. A column of Data 18 shows data. A column of Other 19 shows other data. The other data of the Other 19 is data unknown from the data in the Command 16, the Address 17 and the Data 18, for example, data on which memory is to be accessed.

Figure 6A:
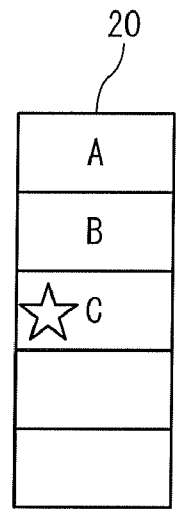
FIG. 6A to 6C are diagrams showing an example of an order of storage into the nonvolatile storage area.
Figure 6B:
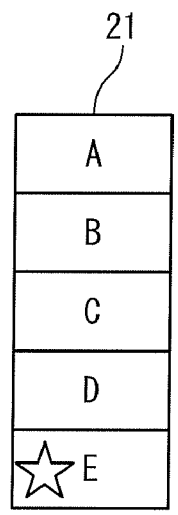
Figure 6C:
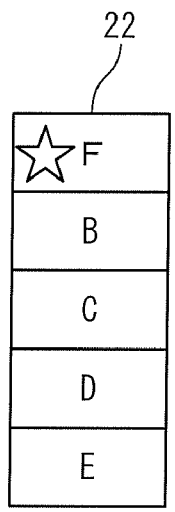

FIG. 6 is a diagram showing an example of the order of storage into the nonvolatile memory device 6. Here, it is assumed that the nonvolatile storage device control section 14 stores data into the nonvolatile memory device 6. A state 20 shows a state in which a part of areas of the nonvolatile memory device 6 is not filled. A state 21 shows a state in which all the areas of the nonvolatile memory device 6 are filled. A state 22 shows a state in which all the areas of the nonvolatile memory device 6 are filled, and then new data is overwritten. A, B, C, D, E, F denote data stored in this order and a star sign denotes a sign representing the latest data. Although the data is stored into the nonvolatile memory device 6 in a predetermined order, the star sign is stored as the data representing the latest data, in FIG. 6. When new data is stored, the star sign representing the latest data which has been stored for old data is erased. Due to this mechanism, even when data is overwritten, it is revealed that the order of data is B →C →D →E →F in the state 22. This is merely an example and it is sufficient that the order of storage can be known.

Next, the data processing system according to a second exemplary embodiment of the present invention will be described. In the data processing system according to the first exemplary embodiment of the present invention, the memory controller 5 and the nonvolatile memory device 6 are separately provided. However, the nonvolatile memory device 6 is provided within the memory controller 5 in the second exemplary embodiment.

Figure 7:
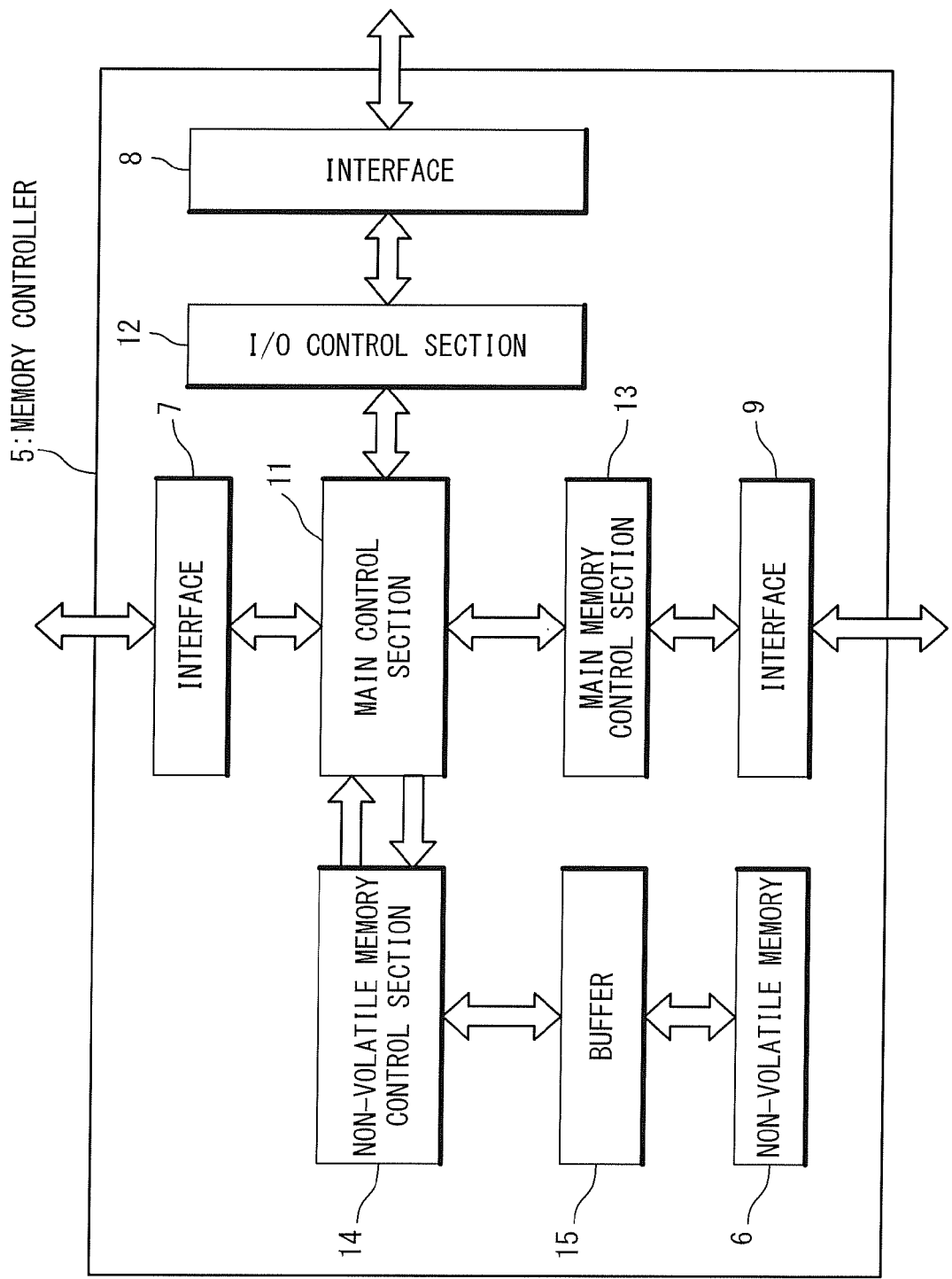
FIG. 7 is a schematic block diagram showing the configuration of the memory controller in the information processing system according to a second exemplary embodiment of the present invention.

FIG. 7 is a block diagram showing a configuration of the memory controller 5 in this exemplary embodiment. In this exemplary embodiment, the memory controller 5 has the interface 7, the interface 8, the interface 9, the main control section 11, the I/O controller control section 12, the main memory control section 13, the nonvolatile storage device control section 14, the buffer 15 and the nonvolatile memory device 6. Here, since the nonvolatile memory device 6 is provided within the memory controller 5, the interface 10 is unnecessary. The remaining components are same as those in the first exemplary embodiment.

In the present exemplary embodiment, a case is assumed that a memory access pattern for a single memory error is stored. However, it is possible to store a plurality of memory access patterns by providing a plurality of nonvolatile storage areas or by dividing the storage area. Here, the data processing system as shown in FIG. 2 is used as an example of the system to which the present invention can be applied. However, a system with any configuration may be employed as long as it uses a memory. The present invention is effective to systems using a memory device, especially, systems such as servers having a problem of a memory error. The present invention can realize a system in which a memory device is used and a memory access pattern can be stored and an error can be reproduced.

As described above, in the system according to the present invention, when an error has occurred in a memory used in the data processing apparatus, a memory access pattern between the memory and the memory controller at the occurrence of the error is stored and the error can be reproduced based on the memory access pattern. According to the present invention, even when only certain memory access pattern causes an error, the reproducibility of the error can be improved and failure analysis through error reproduction can be made easy. Furthermore, by feeding back the memory access pattern data to memory manufacturers, the quality of the memory can be improved.

According to the present invention, it becomes possible to record and reproduce the access pattern at the time of occurrence of the error in the main memory. As a result, it is easy to reproduce the error, facilitating the failure analysis. When only certain access pattern causes the error, the reproducibility of the error can be improved and failure analysis due to failure to reproduce the error can be reduced. Furthermore, by feeding back an error-relating data to memory manufacturers, the quality of the memory can be improved.

Although the present invention has been described above in connection with several exemplary embodiments thereof, it will be appreciated by those skilled in the art that those exemplary embodiments are provided solely for illustrating the present invention, and should not be relied upon to construe the appended claims in a limiting sense.

What is claimed is:

1. An information processing apparatus comprising:
a nonvolatile memory area having a storage area and a main memory, the main memory to store an access pattern; and
a main controller configured to store an access pattern to the main memory of said nonvolatile memory area, is configured to end storage of the access pattern in the main memory of said nonvolatile memory area when an error is detected in said main memory, and is configured to access said main memory based on the access pattern stored in said nonvolatile memory area,
wherein the access pattern comprises:
a pattern of a command executable by the nonvolatile memory area;
an address within the nonvolatile memory area;
a first data signal transmitted from the main controller to the nonvolatile memory area; and,
a second data signal transmitted from the nonvolatile memory area to the main controller responsive to the command being sent from the main controller to the nonvolatile memory area for execution by the nonvolatile memory area, and wherein the main controller compares the access pattern with data stored in the main memory of the nonvolatile memory area to detect the error.

2. The information processing apparatus according to claim 1, wherein said main controller comprises:
   a main memory control unit configured to access said main memory based on the access pattern;
   a nonvolatile memory control unit configured to store a data of the access pattern in said nonvolatile memory area; and
   a main control unit configured to transfer the access pattern for said main memory to said main memory control unit and said nonvolatile memory control unit.

3. The information processing apparatus according to claim 2, wherein said main control unit stops the transfer of the access pattern to said nonvolatile memory control unit when the error has occurred in said main memory.

4. The information processing apparatus according to claim 3, wherein said main control unit issues an instruction to said nonvolatile memory control unit in response to an error reproduction instruction to read out the access pattern data from said nonvolatile memory area.

5. The information processing apparatus according to claim 4, wherein said nonvolatile memory control unit issues an instruction to said main control unit such that said main control unit controls said main memory control unit to access said main memory based on the access pattern read out from said nonvolatile memory area.

6. The information processing apparatus according to claim 2, wherein said nonvolatile memory control unit stores in said nonvolatile memory area, a mark data indicating that a latest data is stored.

7. The information processing apparatus according to claim 2, wherein said nonvolatile memory area is provided in said main controller.

8. A method of reproducing an error in a main memory, comprising:
   storing an access pattern, by a main controller, to a main memory of a nonvolatile memory area;
   ending storage of the access pattern in said nonvolatile memory area, by the main controller, when an error is detected in said main memory;
   accessing said main memory based on the stored access pattern, by the main controller, when the error is detected in said main memory; and,
   comparing, by the main controller, the access pattern with data stored in the main memory of the nonvolatile memory area to detect the error,
   wherein the access pattern comprises:
      a pattern of a command executable by the nonvolatile memory area;
      an address within the nonvolatile memory area;
      a first data signal transmitted from the main controller to the nonvolatile memory area; and,
      a second data signal transmitted from the nonvolatile memory area to the main controller responsive to the command being sent from the main controller to the nonvolatile memory area for execution by the nonvolatile memory area.

9. The method according to claim 8, wherein said storing comprises:
   accessing said main memory based on the access pattern;
   storing a data of the access pattern in said nonvolatile memory area.

10. The method according to claim 8, wherein said accessing comprises:
    reading out the access pattern from said nonvolatile memory area; and
    accessing said main memory based on the read out access pattern.

11. The method according to claim 8, further comprising:
    storing stores a mark indicating a latest data, in said nonvolatile memory area.

* * * * *